United States Patent
Sahoo et al.

(10) Patent No.: US 11,862,688 B2
(45) Date of Patent: *Jan. 2, 2024

(54) INTEGRATED GAN POWER MODULE

(71) Applicant: Apple Inc., Cupertino, CA (US)

(72) Inventors: Ashish K. Sahoo, Santa Clara, CA (US); Brandon Pierquet, San Francisco, CA (US); Derryk C. Davis, Campbell, CA (US); Javier Ruiz, San Jose, CA (US); John M. Brock, San Carlos, CA (US)

(73) Assignee: Apple Inc., Cupertino, CA (US)

( * ) Notice: Subject to any disclaimer, the term of this patent is extended or adjusted under 35 U.S.C. 154(b) by 49 days.

This patent is subject to a terminal disclaimer.

(21) Appl. No.: 17/387,093

(22) Filed: Jul. 28, 2021

(65) Prior Publication Data

US 2023/0030746 A1    Feb. 2, 2023

(51) Int. Cl.

| | |
|---|---|
| *H01L 23/14* | (2006.01) |
| *H01L 29/20* | (2006.01) |
| *H01L 23/31* | (2006.01) |
| *H01L 23/36* | (2006.01) |
| *H01L 23/522* | (2006.01) |
| *H01L 23/532* | (2006.01) |
| *H01L 27/088* | (2006.01) |

(52) U.S. Cl.
CPC .......... *H01L 29/2003* (2013.01); *H01L 23/14* (2013.01); *H01L 23/31* (2013.01); *H01L 23/36* (2013.01); *H01L 23/5226* (2013.01); *H01L 23/53228* (2013.01); *H01L 27/088* (2013.01)

(58) Field of Classification Search
CPC ..... H01L 29/2003; H01L 23/14; H01L 23/31; H01L 23/36; H01L 23/5226; H01L 23/53228; H01L 27/088
See application file for complete search history.

(56) References Cited

U.S. PATENT DOCUMENTS

| | | | |
|---|---|---|---|
| 7,298,047 B2 | 11/2007 | Kawakami et al. | |
| 7,417,299 B2 * | 8/2008 | Hu | ...... H01L 25/0655 257/E23.101 |
| 8,310,067 B2 * | 11/2012 | Zhao | ...... H01L 23/49833 257/E23.101 |
| 9,245,832 B2 * | 1/2016 | Hasegawa | ...... H01L 23/49575 |

(Continued)

OTHER PUBLICATIONS

PCT/US2022/033472, "International Search Report and Written Opinion", dated Oct. 19, 2022, 11 pages.

*Primary Examiner* — Eugene Lee
(74) *Attorney, Agent, or Firm* — Kilpatrick Townsend & Stockton LLP

(57) ABSTRACT

Integrated power modules according to the present technology may include a printed circuit board characterized by a first surface and a second surface. The integrated power modules may include one or more surface-mounted components coupled with the first surface of the printed circuit board. The integrated power modules may include a heat-transfer substrate. The integrated power modules may include one or more gallium nitride transistors coupled between and soldered to each of the second surface of the printed circuit board and the heat-transfer substrate. The integrated power modules may include one or more spacers coupled between and soldered to each of the printed circuit board and the heat-transfer substrate.

20 Claims, 3 Drawing Sheets

(56) References Cited

U.S. PATENT DOCUMENTS

| | | | |
|---|---|---|---|
| 9,293,446 B2* | 3/2016 | Matsumoto | H01L 23/49811 |
| 10,453,802 B2* | 10/2019 | Hu | H01L 23/552 |
| 10,707,157 B2* | 7/2020 | Lee | H01L 23/49513 |
| 11,462,455 B2* | 10/2022 | Yen | H01L 23/66 |
| 2004/0042178 A1* | 3/2004 | Gektin | H01L 23/433 |
| | | | 257/E23.09 |
| 2013/0020119 A1* | 1/2013 | Yoshida | H05K 1/0218 |
| | | | 174/260 |
| 2016/0126157 A1 | 5/2016 | Jeon | |
| 2016/0365296 A1* | 12/2016 | Otremba | H01L 23/3121 |
| 2018/0012857 A1* | 1/2018 | Lin | H01L 21/561 |
| 2019/0109066 A1* | 4/2019 | Kondo | H01L 23/49844 |
| 2019/0173195 A1* | 6/2019 | Kim | H01Q 21/065 |
| 2019/0237373 A1* | 8/2019 | Huang | H05K 1/185 |
| 2019/0273312 A1* | 9/2019 | Otsubo | H01Q 1/38 |
| 2020/0035616 A1 | 1/2020 | Hoegerl et al. | |
| 2021/0005546 A1* | 1/2021 | Pang | H01L 22/20 |
| 2021/0050320 A1* | 2/2021 | Tsai | H01L 25/18 |
| 2021/0136917 A1* | 5/2021 | Otsubo | H05K 3/284 |
| 2021/0202440 A1* | 7/2021 | Chang Chien | H01L 23/5384 |
| 2021/0242144 A1* | 8/2021 | Moriwaki | H01L 23/3677 |
| 2022/0111758 A1 | 4/2022 | Ijaz et al. | |
| 2022/0111759 A1 | 4/2022 | Ijaz | |
| 2022/0115897 A1 | 4/2022 | Ijaz | |
| 2022/0254699 A1* | 8/2022 | Pi | H01L 23/31 |
| 2022/0278080 A1* | 9/2022 | Matsumoto | H03F 3/245 |
| 2023/0026549 A1 | 1/2023 | Ijaz et al. | |

* cited by examiner

INTEGRATED GAN POWER MODULE

TECHNICAL FIELD

The present technology relates to power modules. More specifically, the present technology relates to power modules incorporating gallium nitride components.

BACKGROUND

Power modules are useful for improving efficiency and power density while reducing cost. As more devices with increased power demands are developed, improved power modules are needed.

SUMMARY

Integrated power modules according to some embodiments of the present technology may include a printed circuit board characterized by a first surface and a second surface. The integrated power modules may include one or more surface-mounted components coupled with the first surface of the printed circuit board. The integrated power modules may include a heat-transfer substrate. The integrated power modules may include one or more gallium nitride transistors coupled between and soldered to each of the second surface of the printed circuit board and the heat-transfer substrate. The integrated power modules may include one or more spacers coupled between and soldered to each of the printed circuit board and the heat-transfer substrate.

In some embodiments, the heat-transfer substrate may be an insulated metal substrate. The insulated metal substrate may include a copper base and one or more insulation layers. The one or more surface-mounted components may include at least one of a gate driver, a capacitor, a diode, a switch, or a thermistor. The one or more spacers may include solder-plated copper spacers. At least one spacer may be coupled with a via formed through the printed circuit board, and configured to transfer heat from the one or more surface-mounted components to the heat-transfer substrate. The module may include molding extending between the printed circuit board and the heat-transfer substrate, and further extending about the one or more gallium nitride transistors and the one or more spacers. The modules may include potting extending across the first surface of the printed circuit board and extending about the one or more surface-mounted components. The heat-transfer substrate may be a direct-bonded copper board. The direct-bonded copper board may include a first copper layer coupled with the one or more gallium nitride transistors, a second copper layer, and a ceramic layer. The first copper layer may be characterized by an arcuate profile along the integrated power module. At least a portion of the second copper layer may be removed exposing the ceramic layer.

Some embodiments of the present technology may encompass integrated power modules. The modules may include a printed circuit board characterized by a first surface and a second surface. The modules may include one or more surface-mounted components coupled with the first surface of the printed circuit board. The modules may include a first heat-transfer substrate. The modules may include a second heat-transfer substrate. The modules may include a first gallium nitride transistor coupled between and soldered to each of the second surface of the printed circuit board and the first heat-transfer substrate. The modules may include a second gallium nitride transistor coupled between and soldered to each of the second surface of the printed circuit board and the second heat-transfer substrate.

In some embodiments, the modules may include at least four heat-transfer substrates including the first heat-transfer substrate and the second heat-transfer substrate. The modules may include at least four gallium nitride transistors including the first gallium nitride transistor and the second gallium nitride transistor. The first heat-transfer substrate and the second heat-transfer substrate each may be an insulated metal substrate including a copper base and one or more insulation layers. The modules may include molding extending along the second surface of the printed circuit board, and extending between the first heat-transfer substrate and the second heat-transfer substrate. The first heat-transfer substrate and the second heat-transfer substrate each may be a direct-bonded copper including a ceramic layer between copper layers. The modules may include a transformer core coupled with the first surface of the printed circuit board. The transformer core may separate the surface-mounted components into a first subset of surface-mounted components and a second subset of surface-mounted components. The first heat-transfer substrate may be coupled with the printed circuit board in association with the first subset of surface-mounted components. The second heat-transfer substrate may be coupled with the printed circuit board in association with the second subset of surface-mounted components. The modules may include one or more first spacers coupled between and soldered to each of the printed circuit board and the first heat-transfer substrate. The modules may include one or more second spacers coupled between and soldered to each of the printed circuit board and the second heat-transfer substrate.

Some embodiments of the present technology may encompass integrated power modules. The modules may include a printed circuit board characterized by a first surface and a second surface. The modules may include one or more surface-mounted components coupled with the first surface of the printed circuit board. The modules may include a heat-transfer substrate including an insulated metal substrate including a copper base and one or more insulation layers. The modules may include one or more gallium nitride transistors coupled between and soldered to each of the second surface of the printed circuit board and the heat-transfer substrate. The modules may include one or more spacers coupled between and soldered to each of the printed circuit board and the heat-transfer substrate. The one or more spacers may include solder-plated copper spacers.

Such technology may provide numerous benefits over conventional technology. For example, power modules according to some embodiments of the present technology may be characterized by increased power density due to improved material configurations. Additionally, the power modules according to some embodiments of the present technology may improve heat transfer from the auxiliary circuits, which may improve performance over conventional technologies. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

Figure 1:
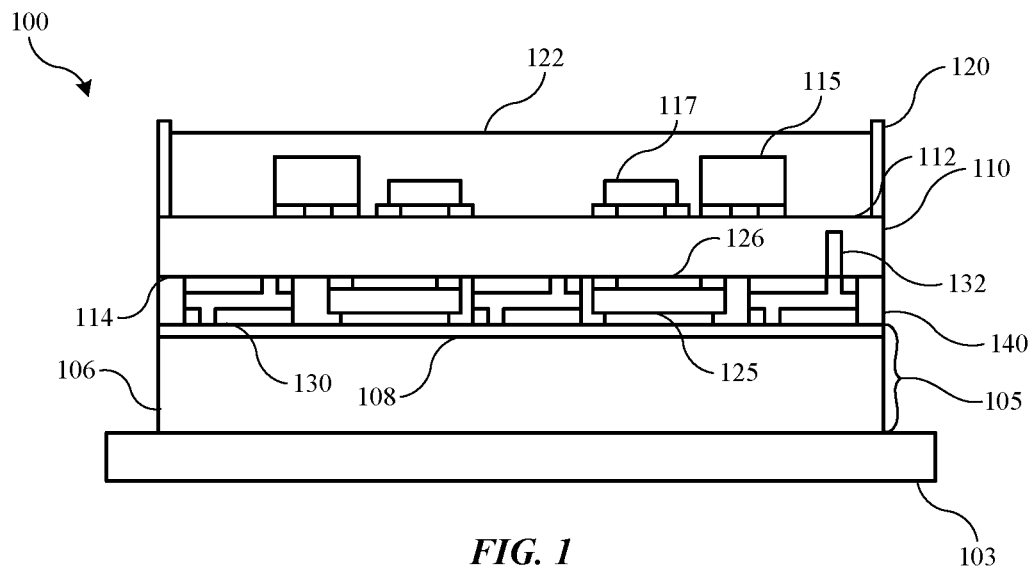
FIG. 1 shows a schematic cross-sectional view of an integrated power module according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Integrated power modules provide packaged semiconductor devices delivering higher power density than many standalone configurations. As power demands are increasing for a host of devices and machines, improved power modules are being developed. For systems requiring increased power levels, integration of the semiconductor devices may determine the overall power density of the power module. As increased demand and faster switching speeds are sought, materials characterized by a wider bandgap are being used. For example, power modules are attempting to incorporate switches or diodes including silicon carbide or gallium nitride. However, these faster switching materials may produce increased heat that can inhibit performance if not properly dissipated from the system.

Many conventional power modules attempting to incorporate silicon carbide or gallium nitride have been limited in operational ability due to lower heat dissipation, which is often a result of the module configuration. A potential solution may be to improve a conduction path from the semiconductor devices to an associated heat sink, such as a cold plate, which may be performed by reducing component spacing and layer separation. However, due to component mismatches, these reductions may have been frustrated or prevented. For example, producing a planar power module including a planar heat-rejection surface may improve conductive contact with a cold plate or other heat sink. Similarly, increasing coupling between the circuitry, semiconductor switches, and baseplate, which may then be coupled with a heat sink, may improve heat dissipation during operation.

Producing these closer couplings may be frustrated in conventional designs due to mismatches between components. For example, a circuit board on which the circuitry is disposed may be characterized by a different coefficient of thermal expansion compared to the baseplate. Were the semiconductor switches directly coupled with each of the circuit board and the baseplate, at least one of the components may warp during soldering operations. For example, the baseplate may warp during soldering operations, which can cause a number of issues. The circuit board may be fiberglass and copper, while the baseplate, such as direct bonded copper, may include ceramics characterized by different thermal properties that will cause the baseplate to warp. During cooling subsequent to the soldering, connections may fracture, which may limit performance, if not lead to yield loss. Additionally, a warped or non-planar baseplate may frustrate coupling with the heat sink, requiring increased coupling material, such as thermal paste, which may increase the thermal resistance between the components and limit performance due to lower heat dissipation. Consequently, many conventional designs are limited to separating the circuit board from the switches and including an additional gate drive board and board-to-board connectors, or producing a structure that will necessarily include a warped baseplate when the switches are soldered to each of the circuit board and the baseplate. Alternatively, some conventional technologies may include a gap pad between the semiconductor devices and the baseplate, which may greatly reduce thermal dissipation to the heat sink, limiting operational capabilities of the module.

The present technology overcomes these issues by utilizing additional baseplate materials or designs, which may accommodate thermal expansion differences between the materials, and may allow closer coupling. By providing a direct coupling solution with the semiconductor device, gate drivers and other components may be positioned in closer proximity to the switches, which may be or include gallium nitride. With this closer connection, the decoupling loop for the capacitor and the gate drive loop may be greatly reduced, improving switching speeds. Consequently, dv/dt and di/dt related losses may be minimized in the present technology, which may allow devices according to some embodiments of the present technology to be operated over wider current and voltage ranges. Improved heat rejection may also be afforded, which may allow the gallium nitride switches to operate faster and more efficiently, further improving device performance.

Although the remaining portions of the description will reference power modules including gallium nitride switches, it will be readily understood by the skilled artisan that the technology is not so limited. The present materials and techniques may be employed with any number of power module topologies and components, including other semiconductor materials such as silicon carbide, or other materials. Moreover, the present technology may be applicable to power modules used in any number of technologies that may include, without limitation, power conversion equipment including motor drives, power supplies, AC-DC power converters, high-voltage to low-voltage converters, or uninterruptable power supplies. The devices may be implementable in power grid applications, green technology such as including solar panels, home appliances, or any other system or device that may benefit from aspects of the present technology.

FIG. 1 shows a schematic cross-sectional view of an integrated power module 100 according to some embodiments of the present technology. The figure may illustrate components and configurations that may be incorporated in any number of power modules according to some embodiments of the present technology. The figure illustrates topside cooled devices in a configuration that may maintain a substantially consistent gap between the circuit board and the baseplate. Although some embodiments of the present technology may utilize direct-bonded copper as a baseplate or heat-transfer substrate as will be described further below, in some embodiments as illustrated, the baseplate or heat-transfer substrate may be or include an insulated metal substrate as the heat-transfer substrate 105. FIG. 1 illustrates a power module that has been coupled with a cooling plate 103 or heat sink, which may be a gas or liquid-flowed heat sink. It is to be understood that the heat sink is illustrated for understanding of coupling according to some embodiments of the present technology, and may not be included in integrated power modules according to some embodiments of the present technology, including integrated power module 100, such as where the heat sink may be incorporated with the system or device in which the power module is installed.

The heat-transfer substrate 105 (e.g., the insulated metal substrate or IMS board) may include a metal substrate 106 as well as one or more layers illustrated as layer 108. Layer 108 may represent one or more layers of insulation material and/or copper foil, as would be understood as being included in an IMS board. In some embodiments, a single insulation layer and a single copper foil layer may be included, although in other embodiments additional layers may be included. For example, by including multiple layers, one or more layers may be utilized as a grounding layer or an electromagnetic compatibility shielding, as well as current and/or thermal distribution layers. Accordingly, it is to be understood that layer 108 may include one or more layers of each of insulation and/or foil in embodiments of the present technology. Additionally, metal substrate 106 may be or include any number of metals, such as aluminum, copper, or other metals, although in some embodiments the metal may be copper. Although aluminum is utilized in some IMS boards, aluminum may be characterized by a coefficient of thermal expansion that may limit or otherwise impact coupling between the layers in configurations as illustrated. By utilizing copper as the metal substrate 106 in some embodiments, a planar substrate and more complete coupling during soldering processes may be maintained. Accordingly, such as in comparison to a direct-bonded copper substrate, although the integrated metal substrate may increase local thermal resistance at the insulation layer or layers, the substrate may afford a substantially planar profile at the base surface to be coupled with a cold plate or other device.

This may maintain an overall increased heat dissipation potential compared to a direct-bonded carbon, which may be warped if soldering is included as described above, and which may be characterized by a greater overall resistance between the power module and a cold plate. By substantially planar is meant to encompass machine tolerances that may prevent perfect planarity, as well as natural surface roughness, but which may maintain a surface profile that may maintain a consistent surface that may provide contact with a cold plate or other component at greater than or about 90% of the base of the integrated metal substrate, and may maintain contact at greater than or about 95%, greater than or about 97%, greater than or about 99%, or more. Similarly, where a thermal grease or paste may be disposed between the integrated metal substrate and the cold plate, a thickness of the thermal paste may be consistent in thickness to +/−1%, +/−0.5%, +/−0.1% or less across greater than or about 90% of the area of contact, and may be maintained across greater than or about 95% of the area of contact, greater than or about 97% of the area of contact, greater than or about 99% of the area of contact, or more.

Integrated power module 100 may include a circuit board 110, which may be any type of printed circuit board, such as an FR4 board in non-limiting embodiments of the present technology. It is to be understood that the circuit board 110 may be any board that may be or include one or more fiberglass and/or copper layers, as well as any other circuit board materials. Any substrate that may operate to maintain auxiliary circuits or components may be encompassed in embodiments of the present technology, and may be used as circuit board 110. Circuit board 110 may be characterized by a first surface 112, and a second surface 114, which may be opposite first surface 112 as illustrated. Mounted along, or coupled with, first surface 112 may be one or more components of a power module, such as surface-mounted components. Illustrated component 115 and component 117 may be or include any number of components in any configuration.

It is to be understood that the present technology may be utilized for power modules characterized by any number of topologies, and any number of components may be included. For example, the components may be or include capacitors, gate drivers, diodes, switches, thermistors, connectors, such as including for a transformer, or sensors, which may be included to produce any topology such as may include switches, bride rectifiers, power converters, neutral-point-clamped configurations, inverters, or other topologies that may include any number of components to produce circuits of various structures. Accordingly, the figure and following figures are not intended to limit any aspect of the present technology. As illustrated, component 115 and component 117 may be soldered to the circuit board 110, although any other coupling may be encompassed by the present technology.

In some embodiments, integrated power module 100 optionally may include a dam 120 or other structure that may be coupled with the circuit board 110 about a periphery of an active region of the first surface 112 of the circuit board 110. The dam may be plastic, rubber, or some polymeric material, which may be glued or otherwise adhered to the first surface 112 of the circuit board 110 as illustrated. Within dam 120 optionally may be included a potting 122 extending across the first surface 112 of the circuit board 110, and which may further extend about the one or more surface mounted components, as illustrated. Potting 122 may be any number of materials, such as any rubber material, epoxy, silicone gel, or any other encapsulation material that may be used in semiconductor or electronic technologies. Additionally, potting 122 may be characterized by an increased thermal conductivity, which may afford improved heat dissipation from components, such as capacitors.

Coupled with the second surface 114 of circuit board 110 may be one or more components, which may also be coupled with the insulated metal substrate. As illustrated, in some embodiments circuit board 110 may be separated from the heat-transfer substrate by the one or more components, although in some embodiments the circuit board may include certain components embedded, and may extend to contact the heat-transfer substrate. The components disposed between the circuit board 110 and the heat-transfer substrate 105 may include one or more gallium nitride components 125, such as switches or transistors, used in power modules. Although the remaining description will identify the components as including gallium nitride, it is to be understood that in some embodiments additional semiconductor materials may be used, such as silicon-containing materials, including silicon or silicon carbide. Additionally, although two gallium nitride components 125 are illustrated, it is to be understood that integrated power modules according to some embodiments of the present technology may include any number of gallium nitride components 125, including greater than or about 2, greater than or about 4, greater than or about 6, greater than or about 8, greater than or about 10, or more, depending on the topology, device size, and component configurations, for example.

The gallium nitride components 125 may be coupled between the circuit board 110 and the heat-transfer substrate 105 as previously noted, and may be in contact with each component, such as being directly soldered to each of the second surface 114 of the circuit board 110 and the heat-transfer substrate 105 as illustrated. Additionally, to improve coupling and maintain location during the soldering process, in some embodiments an underfill 126 may be included along either surface of the gallium nitride components 125, such as between the solder contacts along the second surface 114 of the circuit board 110, as illustrated. Underfill 126 may be any number of materials used in solder underfilling, and may include an epoxy or other polymeric material along with any number of fillers, flow agents, or other materials.

In some embodiments, integrated power modules according to the present technology may include one or more spacers 130, which may be positioned at one or more positions between the circuit board 110 and the heat-transfer substrate 105. Similar to gallium nitride components 125, spacers 130 may be coupled between the circuit board 110 and the heat-transfer substrate 105, and may be soldered to each of the circuit board 110 and the heat-transfer substrate 105. Spacers 130 may include a metal material, such as copper, or some other material, which may provide one or more benefits to the power module, and the metal material may be plated with solder or other conductive coupling materials. For example, spacers 130 may be incorporated to maintain a specific gap distance between circuit board 110 and heat-transfer substrate 105 during reflow operations where solder on each side of the gallium nitride components 125 and/or spacers 130 may be melted to engage with the corresponding surfaces of the circuit board and the heat-transfer substrate.

Spacers 130 may be positioned about a periphery of the boards, as well as within an internal area, and may be used to facilitate heat transfer from the circuit board in some embodiments. For example, in some embodiments one or more vias 132 may be formed at locations proximate one or more spacers, which may more readily draw heat from surface-mounted components to the spacers and underlying heat-transfer substrate. Vias 132 may extend at least partially through the circuit board 110, and may extend fully through the circuit board 110 in some embodiments. The vias may couple with wire tracing or other heat sinks within the circuit board, as well as coupling proximate or with one or more surface-mounted components in embodiments of the present technology. Spacers 130 may similarly afford current sharing between the circuit board and the heat-transfer substrate based on coupling with layers of the components. Additionally, the spacers may be incorporated to provide electromagnetic compatibility shielding connection locations about the power module. The spacers may couple with foil layers of the heat-transfer substrate, as well as with the base metal layer, in some embodiments. Regardless, the spacers may provide access to the heat-transfer substrate, which may then provide lateral and vertical distribution and dissipation of heat.

In some embodiments a molding 140 may be incorporated between and extend along and/or contact each of the circuit board 110 and the heat-transfer substrate 105. Molding 140 may be any number of encapsulating materials used in semiconductor packaging, for example, and may include any of the materials noted previously for potting as well as other epoxy resins, hardeners, fillers, catalysts, or other agents that may be incorporated in molding or overmolding. Molding 140 may extend about the gallium nitride components 125, as well as the spacers 130, in some embodiments, and may provide additional rigidity to the power module and components.

Additionally, the molding 140 may provide environmental protection, which may facilitate lower creepage and clearance requirements, and which may allow closer coupling of components, for example. This may increase the module density, while providing a stable package that can further distribute heat for improved heat transfer. Although shown at a similar lateral dimension as each of the circuit board 110 and the heat-transfer substrate 105, in some embodiments the components may not be similarly sized. For example, in some embodiments the circuit board 110 may be characterized by longer lateral dimensions than the heat-transfer substrate. In some embodiments, the molding may then extend about the heat-transfer substrate and increase the lateral dimensions in order to provide conformity of dimensions about the power module. During dicing, the molding and/or the circuit board may be trimmed to provide vertical sidewalls for each material, for example.

Integrated power modules according to embodiments of the present technology may also include one or more modifications to the structure illustrated in FIG. 1, and which may provide additional flexibility to the module for a variety of environments and configuration capabilities. It is to be understood that any of the designs illustrated may show additional features of power module 100, or may include any feature or aspect of power module 100 described above.

Figure 2:
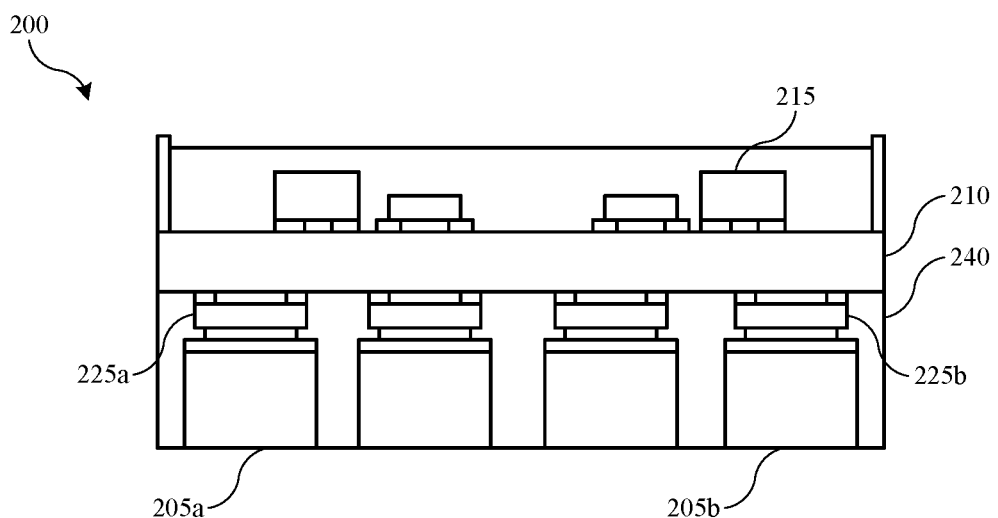
FIG. 2 shows a schematic cross-sectional view of an integrated power module according to some embodiments of the present technology.

Turning to FIG. 2 is shown a schematic cross-sectional view of an integrated power module 200 according to some embodiments of the present technology, and which may include more than one heat-transfer substrate. Integrated power module 200 may include any feature, aspect, component, or material from integrated power module 100, and may illustrate additional features of integrated power module 100 in some embodiments. For example, integrated power module 200 may include any number of components as previously described, and which may be included in power module 200. Integrated power module 200 may include multiple heat-transfer substrates, such as a first heat-transfer substrate 205*a* and a second heat-transfer substrate 205*b*, which may include any aspect of heat-transfer substrates discussed previously, and which may be an insulated metal substrate as previously described. The module may include a circuit board 210, which may include one or more surface-mounted components 215 on a first surface of the circuit board, and which may be any of the materials and components previously described.

The power module may include one or more gallium nitride components as previously described, and may include a number of heat-transfer substrates that is less than or equal to the number of gallium nitride components. For example, each gallium nitride component may include a corresponding heat-transfer substrate, or multiple gallium nitride components may share a heat-transfer substrate. Although any number of transistors or switches may be included in embodiments according to the present technology, in some embodiments the power module may include at least a first gallium nitride component 225a and a second gallium nitride component 225b. Each of the components may be coupled between and soldered to the second surface of the circuit board 210. Additionally, the components may be soldered to a corresponding heat-transfer substrate. For example, as illustrated, first gallium nitride component 225a may be coupled with first heat-transfer substrate 205a, and second gallium nitride component 225b may be coupled with second heat-transfer substrate 205b. As shown, the power module may also include a third heat-transfer substrate coupled with a third gallium nitride component, and a fourth heat-transfer substrate coupled with a fourth gallium nitride component. Consequently, any number of transistors and heat-transfer substrates may be incorporated in power modules according to embodiments of the present technology.

In some embodiments potting optionally may be included as previously discussed, and a molding 240 may be included to support the power module and provide rigidity to the individual heat-transfer substrates and transistors. Molding 240 may extend along the second surface of the circuit board 210, and may extend about and between the heat-transfer substrates and gallium nitride components. As explained previously, bonding the gallium nitride components to the circuit board and heat-transfer substrates may cause an amount of deformation of one of the substrates. By limiting the size of the substrate to be similar to the size of the component, stress produced due to mismatch may be accommodated. Additionally, subsequent the reflow operation and/or the molding formation, a planarization operation may be performed along a base of the power module to ensure a substantially planar surface across and along each of the heat-transfer substrates for coupling with a cold plate, for example. Although heat transfer may be reduced relative to a larger heat-transfer substrate as illustrated elsewhere in this disclosure, in some embodiments the individual heat-transfer substrates or the planarization operations may allow more flexibility of heat-transfer substrates, which may afford reduced packaging sizing as will be described further below.

Figure 3:
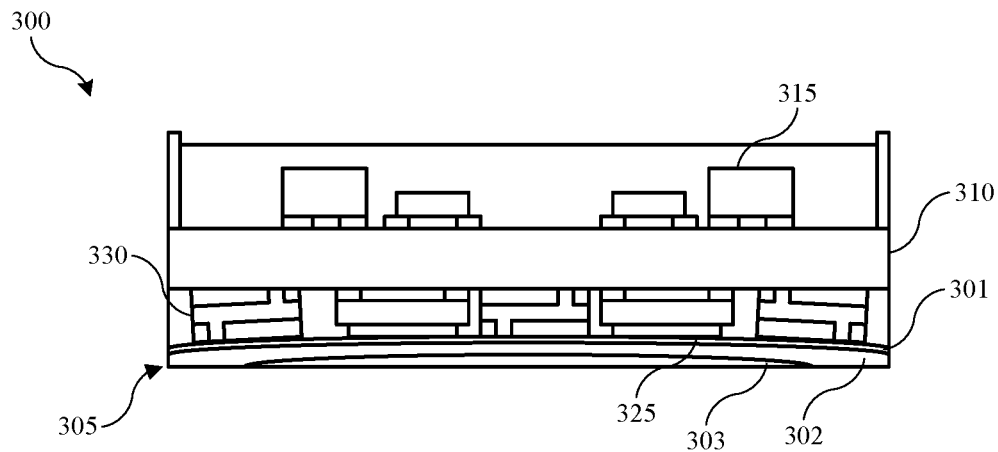
FIG. 3 shows a schematic cross-sectional view of an integrated power module according to some embodiments of the present technology.

FIG. 3 shows a schematic cross-sectional view of an integrated power module 300 according to some embodiments of the present technology, and which may include a direct-bonded copper substrate as the heat-transfer substrate. Integrated power module 300 may include any feature, aspect, component, or material from integrated power module 100, and may illustrate additional features of integrated power module 100 in some embodiments. For example, integrated power module 300 may include a heat-transfer substrate 305 characterized by a reduced thickness, such as a direct-bonded copper substrate, for example. The power module may include any number of other components as discussed previously for any other power module. For example, the module may include circuit board 310, which may include one or more surface-mounted components 315 on a first surface of the circuit board, and which may be any of the materials and components previously described. The integrated power module 300 may include any number of gallium nitride components 325 as well as spacers 330, which may be or include any of the components or configurations as discussed above. The module also optionally may include potting and/or molding as discussed above.

As discussed previously, the soldering process for coupling the gallium nitride components with the circuit board and the heat-transfer substrate will cause the direct-bonded copper substrate to warp due to differences in the coefficient of thermal expansion of the substrate relative to the circuit board. Solder plated on each of the components may be used to accommodate the flexing that will occur in order to protect the coupling from fracturing during cooling. For example, the thickness of solder, or the size of solder bumps, may be adjusted across the substrate where an increased amount of solder may be utilized proximate edge regions or other locations where more deflection may occur. When the heat-transfer substrate 305 is a direct-bonded copper substrate, the substrate 305 may include a first layer of copper 301 and a second layer of copper 303 on opposite surfaces of a layer of a ceramic base 302, where the first layer of copper 301 may be coupled with the components.

The cooling process after soldering may cause the heat-transfer substrate to warp in any number of ways, and an arcuate profile may be produced. As explained previously, conventional technologies would be limited to increasing a thermal coupling layer, such as thermal paste, which may reduce heat transfer between the heat-transfer substrate and the cold plate, for example. The present technology may include modifications to the substrate as well as the soldering process. For example, during the reflow process where the solder may be heated, as well as during subsequent cooling, pressure may be applied across the power module, either upwards on the heat-transfer substrate, and/or downwards on the circuit board, which may reduce an amount of deflection during cooling. Again, the amount of solder may be adjusted to accommodate stress caused by the process. Accordingly, the amount of deflection may be reduced or minimized.

Additionally, in some embodiments a subsequent planarization operation may be performed along the backside of the heat-transfer substrate. For example, as illustrated in FIG. 3, a portion of the second copper layer 303 may be removed, as well as a portion of the ceramic layer 302 that may be exposed during the removal and depending on the extent of deflection, such as by grinding or other removal operations. This removal may produce a substantially planar profile across a backside of the heat-transfer substrate. Consequently, during a subsequent coupling with a cold plate, for example, similar contact or thermal paste thicknesses may be afforded as previously described. Despite the potential loss of copper on edge regions as illustrated, the improved thermal conductivity of the direct-bonded substrate may improve overall performance. Additionally, a subsequent operation may be performed to ensure copper along the base of the surface. For example, copper foil may be applied across the backside of the heat-transfer substrate subsequent the removal operation, for example, or copper may be applied or sputtered across the backside to improve a heat transfer profile. Hence, in some embodiments of the present technology, direct-bonded copper substrates may be employed as the heat-transfer substrate by accommodating the deformation that may occur during bonding.

Figure 4:
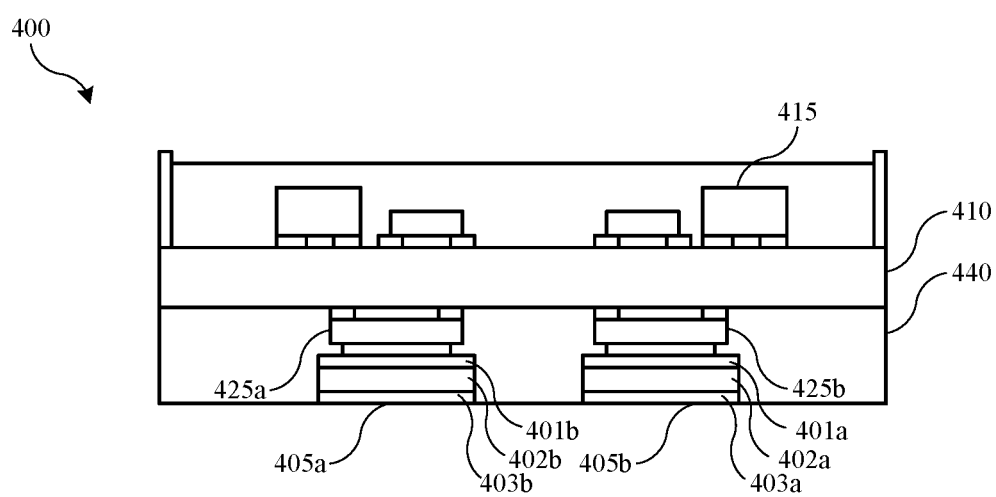
FIG. 4 shows a schematic cross-sectional view of an integrated power module according to some embodiments of the present technology.

Additionally, direct-bonded copper substrates may be used in similar configurations as discussed previously with regard to FIG. 2, where individual heat-transfer substrates are coupled with each of the gallium nitride switches. FIG. 4 shows a schematic cross-sectional view of an integrated power module 400 according to some embodiments of the present technology, and which may illustrate incorporation of direct-bonded copper substrates as individual heat-transfer substrates. Integrated power module 400 may include any feature, aspect, component, or material from integrated power module 100, and may illustrate additional features of integrated power module 100 in some embodiments. Additionally, integrated power module 400 may include any of the features or aspects of integrated power module 200 discussed above, and which may include a similar design.

For example, integrated power module 400 may include any number of components as previously described, and which may be included in power module 400. Integrated power module 400 may include multiple heat-transfer substrates, such as a first heat-transfer substrate 405a and a second heat-transfer substrate 405b, which may include any aspect of heat-transfer substrates discussed previously, and which may be direct-bonded copper substrates as previously described. The first heat-transfer substrate 405a may include a first layer of copper 401a and a second layer of copper 403a on opposite surfaces of a layer of a ceramic base 402a. The second heat-transfer substrate 405b may include a first layer of copper 401b and a second layer of copper 403b on opposite surfaces of a layer of a ceramic base 402a. The first layers of copper 401a, 401b may be corresponding coupled with components (e.g., gallium nitride components 425a, 425b). The module may include a circuit board 410, which may include one or more surface-mounted components 415 on a first surface of the circuit board, and which may be any of the materials and components previously described.

The power module may include one or more gallium nitride components as previously described, and may include a number of heat-transfer substrates that is less than or equal to the number of gallium nitride components. For example, each gallium nitride component may include a corresponding heat-transfer substrate. Although any number of transistors or switches may be included in embodiments according to the present technology, in some embodiments the power module may include at least a first gallium nitride component 425a and a second gallium nitride component 425b. Each of the components may be coupled between and soldered to the second surface of the circuit board 410. Additionally, the components may be soldered to a corresponding heat-transfer substrate. For example, as illustrated, first gallium nitride component 425a may be coupled with first heat-transfer substrate 405a, and second gallium nitride component 425b may be coupled with second heat-transfer substrate 405b. Again, it is to be understood that any number of transistors and heat-transfer substrates may be incorporated in power modules according to embodiments of the present technology. In some embodiments, potting optionally may be included as previously discussed, and a molding 440 may be included to support the power module and provide rigidity to the individual heat-transfer substrates and transistors. Molding 240 may extend along the second surface of the circuit board 210, and may extend about and between the heat-transfer substrates and gallium nitride components.

As explained above, direct-bonded copper substrates may be more likely to warp during cooling subsequent to a soldering process. By utilizing heat-transfer substrates that are sized similarly to, or slightly larger than, the switches, deformation may be limited or prevented during cooling. Additionally, as discussed previously, a subsequent planarization may be performed along the backside of the power module. However, with reduced sizing for the heat-transfer substrates, planarization may be limited, and may substantially maintain the copper on the backside of the direct-bonded copper substrate, which may improve heat transfer from the devices.

Figure 5:
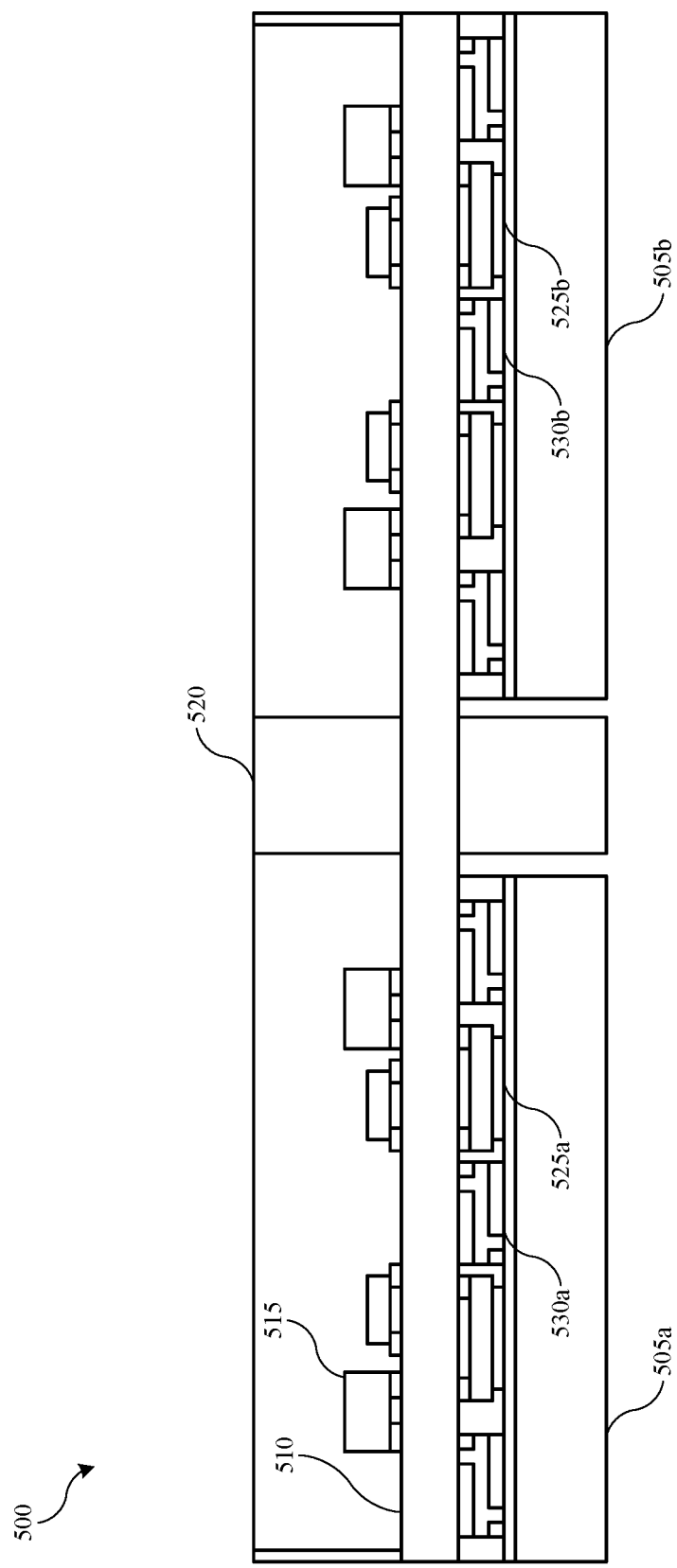
FIG. 5 shows a schematic cross-sectional view of an integrated power module according to some embodiments of the present technology.

FIG. 5 shows a schematic cross-sectional view of an integrated power module 500 according to some embodiments of the present technology, and which may show a power converter having incorporated transformer coils. Integrated power module 500 may include any feature, aspect, component, or material from any of the integrated power modules as discussed above, and may illustrate additional features of any integrated power module previously described, in some embodiments. For example, integrated power module 500 may be a power converter including multiple power modules on a single circuit board. For example the power converter may include an AC-to-DC converter including each module and the associated transformers, a high-voltage-to-low-voltage converter including each module and the associated transformers, or any other structure.

As illustrated, the structure may include any number of components as previously described, and which may be included in power module 500. Integrated power module 500 may include multiple heat-transfer substrates, such as a first heat-transfer substrate 505a and a second heat-transfer substrate 505b, which may include any aspect of heat-transfer substrates discussed previously, and which may be any of the substrates as previously described. The module may include a circuit board 510, which may include one or more surface-mounted components 515 on a first surface of the circuit board, and which may be any of the materials and components previously described. Additionally, the components mounted across the circuit board may be separated into a first subset of components and a second subset of components, which may be on either side of a transformer coil 520, which may separate the two modules of the converter. It is to be understood that the transformer is illustrated schematically to facilitate understanding of the device, and may be considerably larger than shown relative to other components of the converter or modules.

The transformer coil 520 may be coupled with the first surface of the circuit board, and a second transformer coil may be coupled with the second surface of the circuit board between the two modules formed. Such a design may eliminate the need for transformer connectors, where the transformer may be characterized by embedded coils in the circuit board. This configuration may also provide a lower profile converter. Additionally, potting included on the top side, when used, may be included about the transformer coil as well, which may support and protect the components of the entire module.

The heat-transfer substrates may be separated to support the incorporated modules, where heat-transfer substrate 505a may support a first module of the converter, and heat-transfer substrate 505b may support a second module of the converter. For example, the heat-transfer substrate 505a may be coupled with a first subset of gallium nitride components 525a and optional spacers 530a, and which may be coupled with a first region of the circuit board 510, and associated with components on the circuit board for a first module. Similarly, the heat-transfer substrate 505b may be coupled with a second subset of gallium nitride components 525b and optional spacers 530b, and which may be coupled with a second region of the circuit board 510, and associated with components on the circuit board for a second module. The components and couplings may include any aspects of similarly-named components as described previously. By utilizing components and configurations according to embodiments of the present technology, improved power modules may be produced, which may overcome limitations in conventional configurations, and improve efficiency and heat transfer within the device.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing or based on any of those values is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the spacer" includes reference to one or more spacers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. An integrated power module comprising:
a printed circuit board characterized by a first surface and a second surface, and including a thermal via extending from the second surface towards the first surface;
one or more surface-mounted components coupled with the first surface of the printed circuit board;
a heat-transfer substrate;
one or more gallium nitride transistors coupled between and soldered to each of the second surface of the printed circuit board and the heat-transfer substrate; and
a spacer coupled between and soldered to each of the printed circuit board and the heat-transfer substrate, wherein the spacer is directly coupled to the thermal via.

2. The integrated power module of claim 1, wherein the heat-transfer substrate is an insulated metal substrate.

3. The integrated power module of claim 2, wherein the insulated metal substrate comprises a copper base and one or more insulation layers.

4. The integrated power module of claim 1, wherein the one or more surface-mounted components comprise at least one of a gate driver, a capacitor, a diode, a switch, or a thermistor.

5. The integrated power module of claim 1, wherein the one or more spacers comprise solder-plated copper spacers.

6. The integrated power module of claim 5, wherein at least one spacer is coupled with a via formed through the printed circuit board, and configured to transfer heat from the one or more surface-mounted components to the heat-transfer substrate.

7. The integrated power module of claim 1, further comprising:
molding extending between the printed circuit board and the heat-transfer substrate, and further extending about the one or more gallium nitride transistors and the one or more spacers.

8. The integrated power module of claim 1, further comprising:
potting extending across the first surface of the printed circuit board and extending about the one or more surface-mounted components.

9. An integrated power module comprising:
a printed circuit board characterized by a first surface and a second surface, and including a thermal via extending from the second surface towards the first surface;
one or more surface-mounted components coupled with the first surface of the printed circuit board;
a first heat-transfer substrate;
a second heat-transfer substrate;
a first gallium nitride transistor coupled between and soldered to each of the second surface of the printed circuit board and the first heat-transfer substrate;
a second gallium nitride transistor coupled between and soldered to each of the second surface of the printed circuit board and the second heat-transfer substrate; and
a first spacer coupled between and soldered to each of the printed circuit board and the first heat-transfer substrate, wherein the spacer is directly coupled to the thermal via.

10. The integrated power module of claim 9, wherein at least one of the first and second heat-transfer substrates comprise a direct-bonded copper board.

11. The integrated power module of claim 10, wherein the direct-bonded copper board comprises a first copper layer coupled with the one or more gallium nitride transistors, a second copper layer, and a ceramic layer, and wherein the first copper layer is characterized by an arcuate profile along the integrated power module.

12. The integrated power module of claim 11, wherein at least a portion of the second copper layer is removed exposing the ceramic layer.

13. The integrated power module of claim 9, further comprising:
at least four heat-transfer substrates including the first heat-transfer substrate and the second heat-transfer substrate; and
at least four gallium nitride transistors including the first gallium nitride transistor and the second gallium nitride transistor.

14. The integrated power module of claim 9, wherein the first heat-transfer substrate and the second heat-transfer substrate each are an insulated metal substrate comprising a copper base and one or more insulation layers.

15. The integrated power module of claim 9, further comprising:
molding extending along the second surface of the printed circuit board, and extending between the first heat-transfer substrate and the second heat-transfer substrate.

16. The integrated power module of claim 9, wherein the first heat-transfer substrate and the second heat-transfer substrate each are a direct-bonded copper including a ceramic layer between copper layers.

17. The integrated power module of claim 9, further comprising:
a transformer core coupled with the first surface of the printed circuit board, wherein the transformer core separates the surface-mounted components into a first subset of surface-mounted components and a second subset of surface-mounted components.

18. The integrated power module of claim 17, wherein the first heat-transfer substrate is coupled with the printed circuit board in association with the first subset of surface-mounted components, and wherein the second heat-transfer substrate is coupled with the printed circuit board in association with the second subset of surface-mounted components.

19. The integrated power module of claim 17, further comprising
one or more second spacers coupled between and soldered to each of the printed circuit board and the second heat-transfer substrate.

20. An integrated power module comprising:
a printed circuit board characterized by a first surface and a second surface, and including a via extending from the second surface towards the first surface;
one or more surface-mounted components coupled with the first surface of the printed circuit board;
a heat-transfer substrate comprising an insulated metal substrate including a copper base and one or more insulation layers;
one or more gallium nitride transistors coupled between and soldered to each of the second surface of the printed circuit board and the heat-transfer substrate; and
a spacer coupled between and soldered to each of the printed circuit board and the heat-transfer substrate, wherein:
the spacer is directly coupled to the via; and
wherein the one or more spacers comprise solder-plated copper spacers.

* * * * *